United States Patent [19]

Yamashita et al.

[11] 4,053,370
[45] Oct. 11, 1977

[54] PROCESS FOR THE FABRICATION OF PRINTED CIRCUITS

[75] Inventors: Keizo Yamashita, Shizuoka; Tatsuo Wada; Yukio Okamura, both of Shimizu, all of Japan; William H. Safranek, Columbus, Ohio

[73] Assignee: Koito Manufacturing Company Limited, Tokyo, Japan

[21] Appl. No.: 722,479

[22] Filed: Sept. 13, 1976

[30] Foreign Application Priority Data

Sept. 18, 1975 Japan ................................ 50-113244
Sept. 18, 1975 Japan ................................ 50-113245

[51] Int. Cl.$^2$ .......................... C25D 1/04; C25D 1/20
[52] U.S. Cl. ......................................... 204/13; 204/15; 204/231
[58] Field of Search .................... 204/12, 13, 28, 15, 204/231

[56] References Cited

U.S. PATENT DOCUMENTS

| | | | |
|---|---|---|---|
| 3,414,487 | 12/1968 | Helms et al. | 204/13 |
| 3,674,656 | 7/1972 | Yates | 204/13 |
| 3,799,847 | 3/1974 | Vladimirovna | 204/13 |
| 3,984,598 | 10/1976 | Sarazin et al. | 204/35 R |

Primary Examiner—T. M. Tufariello
Attorney, Agent, or Firm—George B. Oujevolk

[57] ABSTRACT

A metal surface such as an endless strip of stainless steel is masked with a plating resist, leaving exposed areas to form a desired circuit pattern. The circuit pattern comprising a high density major layer and a roughened surface layer is formed by copper electroplating on the masked metal surface as same is made cathodic in a copper sulfate bath and successively held opposite to first and second insoluble anodes therein. In order to realize a high copper deposition rate, the electrolyte is caused to flow turbulently at an elevated temperature through the spacings between the metal surface and the first and second anodes. The completed circuit pattern has its roughened surface layer bonded to an adhesive-coated strip of insulating base and is separated from the metal surface. If desired, an adhesive-coated strip of overlay may then be bonded to the circuit pattern on the insulating base strip. The complete process can be automated.

8 Claims, 6 Drawing Figures

PROCESS FOR THE FABRICATION OF PRINTED CIRCUITS

BACKGROUND OF THE INVENTION

Our invention relates to the fabrication of printed circuits, and is directed more specifically to a process for fabricating printed circuits or printed circuit boards by plating. The process according to our invention is particularly well adapted for the automatic, continuous fabrication of printed circuits.

Of the numerous processes known and used in the fabrication of printed circuits, the wet etching process has had perhaps the most extensive acceptance in the industry, especially for the manufacture of high quality printed circuits. This prior art process is rather complex, however, involving the steps of cladding a base of electrically insulating material with a copper foil, forming an etchant-resist mask or pattern on the copper foil, etching away those areas of the copper foil which are exposed through the etchant-resist mask, and applying an overlay on the copper circuit pattern. Although these individual steps may be automated, it is difficult to integrate all the steps into an automatic procedure, so that this known process is not suitable for the economical manufacture of high quality printed circuits.

The wet etching process has another serious problem arising from the fact that up to about 60% or more of the copper foil over the insulating base must be removed in an etchant bath containing ferric chloride, cupric chloride, ammonium persulfate or the like. There are difficulties involved in recovery of the dissolved copper from the etchant and in regeneration of the etchant for repeated use, thus necessitating a further increase in the manufacturing costs of the printed circuits. An additional problem resides in the disposal of the waste liquid, which requires considerable expenses for the installation and maintenance of the necessary equipment.

In an attempt to overcome the above noted problems arising from the removal of a large proportion of the copper foil from the insulating base, there has been suggested a process wherein a circuit pattern is formed by electroplating of copper. The conventional plating process, however, permits current densities up to about 0.2 ampere per square centimeter, with the consequent copper deposition rate of only about 2 microns per minute at the maximum. Such a low deposition rate makes it practically impossible to synchronize the plating operation with other steps of, for example, bonding the deposited circuit pattern to an insulating base or bonding an overlay to the circuit pattern.

Furthermore, according to the prior art wet etching and plating processes, which are both difficult of automation as above explained, the produced circuit patterns are usually left exposed for a certain length of time, thereby giving rise to the possibility of their rusting. The prior art plating process has an additional problem in connection with the step of roughening the surface of a circuit pattern to strengthen its adhesion to an insulating base through increase of the surface area. Heretofore, this operation has been performed independently of the plating of the circuit pattern, as after the oxidation treatment. The independent surface roughening operation adds to the manufacturing cost and also has been an impediment to the full automation of the process.

SUMMARY OF THE INVENTION

It is an object of our invention to provide an improved process for the fabrication of printed circuits which lends itself to ready automation.

Another object of our invention is to provide a process wherein circuit patterns are formed directly by plating without any wasteful use of conductive material such as copper, so that the aforementioned problems attendant upon the prior art wet etching process are thoroughly overcome.

A further object of our invention is to provide an improved plating process whereby circuit patterns can be formed with an extremely high deposition rate, so that in the fabrication of successive printed circuits, the plating operation can be synchronized with other steps to realize the automation of the complete process.

A further object of our invention is to provide a process wherein a circuit pattern comprising a high density major layer and a roughened surface layer is formed by an essentially single plating step, with the roughened surface layer being intended to strengthen the adhesion of the circuit pattern to an insulating base.

A further object of our invention is to provide a process wherein a completed circuit pattern is immediately attached to a base and is further covered with an overlay, thereby eliminating the possibility of rusting.

A still further object of our invention is to provide a process which is particularly suitable for the fabrication of flexible printed circuit boards.

Briefly, the process according to our invention comprises the steps of masking a metal surface with a plating resist so as to leave exposed areas to form a circuit pattern, forming a major layer of the circuit pattern by depositing metal such as copper on the metal surface through the plating resist mask in a plating bath, forming a roughened surface layer of the circuit pattern by depositing the same metal on the major layer in the same plating bath, and attaching the completed circuit pattern to an insulating base by bonding its roughened surface layer thereto. The circuit pattern can be bonded to the insulating base either before, after or substantially concurrently with the separation thereof from the metal surface.

According to a feature of our invention, during formation of the circuit pattern by copper electroplating of the masked metal surface, the electrolyte is caused to flow turbulently and at elevated temperatures between the cathodic metal surface and the anodes. Such turbulent flow of the electrolyte results in a marked increase in the copper deposition rate, and the extremely high deposition rate thus realized is one of the requisites for the automation of the complete fabrication process.

Preferably, the completed circuit pattern that has been bonded to the insulating base and separated from the metal surface is then immediately covered with an overlay to obviate the possibility of rusting. The plating resist mask may be removed from the metal surface following the separation of the circuit pattern therefrom. In order to simplify the fabrication process, however, the circuit pattern and the mask can both be bonded to the insulating base, separated from the metal surface, and covered with an overlay.

The above and other objects, features and advantages of our invention and the manner of attaining them will become more clearly apparent, and the invention itself will best be understood, upon consideration of the following description taken in connection with the accompanying drawings.

DETAILED DESCRIPTION

Figure 1:
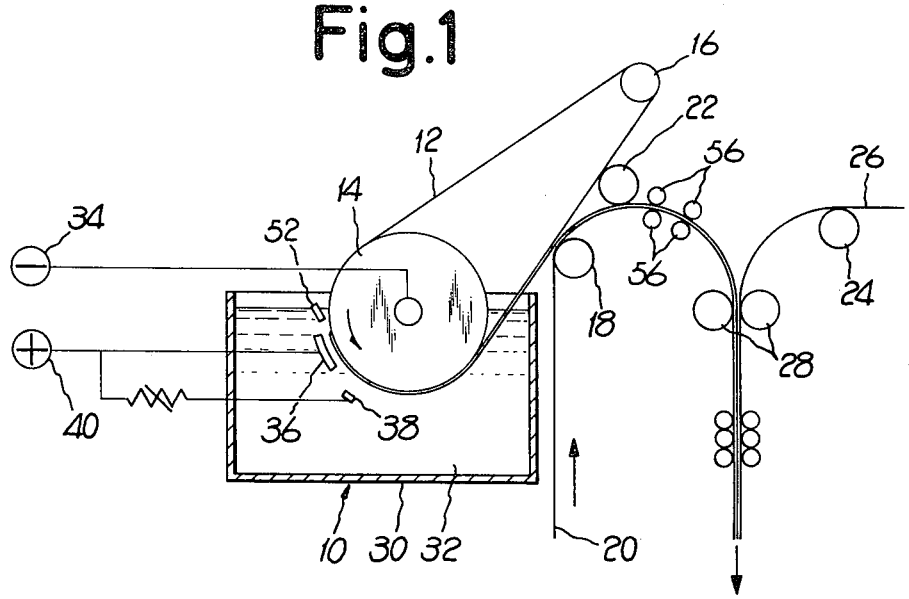
FIG. 1 is a schematic representation of apparatus whereby printed circuits can be fabricated in accordance with the process of our invention.

With reference to FIG. 1, which diagrammatically illustrates one arrangement useful in practicing our invention, the reference numeral 10 generally denotes electroplating equipment for the production of copper circuit patterns. By use of this equipment 10, copper is to be deposited in the shape of a desired circuit pattern on an endless strip 12 of metal such as stainless steel or nickel extending between a pair of rolls 14 and 16. The illustrated arrangement further comprises a first heater roll 18 for bonding under heat and pressure a continuous, adhesive-coated strip 20 of insulating base to the copper circuit pattern which has been formed on the endless metal strip 12, a separator roll 22 for separating or peeling from the endless metal strip the copper circuit pattern bonded to the insulating base strip, a second heater roll 24 for heating a continuous, adhesive-coated strip 26 of overlay, and a pair of squeeze rolls 28 for bonding the heated overlay strip to the copper circuit pattern on the insulating base strip.

The electroplating equipment 10 includes a tank 30 containing an acid copper bath or electrolyte 32. The aforesaid roll 14 is at least partly immersed in the bath 32 and is electrically connected to a negative supply terminal 34. The roll 14 is in electrically conducting relationship to the endless metal strip 12, so that this metal strip is made cathodic in the bath.

Shown at 36 and 38 are first and second anodes of the insoluble type which are disposed opposite to the metal strip 12 passing over the roll 14 within the bath 32 and which are electrically connected to a positive supply terminal 40. The first anode 36 should be spaced from the cathodic metal strip 12 a distance in the range of from about 1 to 10 millimeters, for better results from about 1 to 5 millimeters, and for the best results about 2 millimeters. The second anode 38 is disposed forwardly of the first anode 36 with respect to the predetermined direction of travel of the metal strip 12 through the bath 32, which direction is indicated by the arrow in FIG. 1. The spacing between this second anode and the metal strip should be in the range of from about 5 to 25 millimeters, for better results from about 8 to 20 millimeters, and for the best results from about 10 to 15 millimeters. It is of absolute necessity, however, that the spacing between first anode 36 and metal strip 12 be less than the spacing between second anode 38 and metal strip 12.

For carrying out the process of our invention by use of the apparatus of the foregoing configuration, part of the metal strip 12 is first masked with a suitable plating resist, leaving exposed the areas that will form the desired circuit pattern, by the known printing process or by utilizing a photoresist. The plating resist mask applied to the metal strip 12 may be dried and hardened by means of an oven or by exposure to ultraviolet light.

Figure 2:
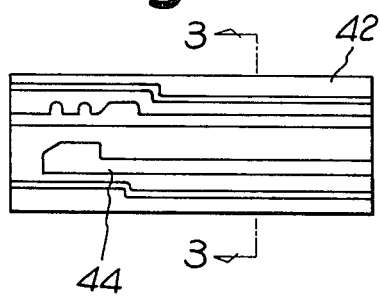
FIG. 2 is a plan view showing an example of a plating resist mask used in the process of the invention.
Figure 3:
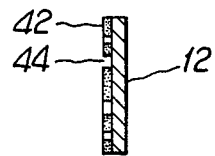
FIG. 3 is a sectional view taken along the line 3—3 of FIG. 2.

FIGS. 2 and 3 illustrate an example of the plating resist mask 42 thus formed on the metal strip 12. It will be observed from these drawings that the mask 42 defines openings 44 that are formed in the shape of the circuit pattern. Copper is to be subsequently selectively electrodeposited on the metal strip 12 through the mask openings 44 to form the circuit pattern.

Figure 4:
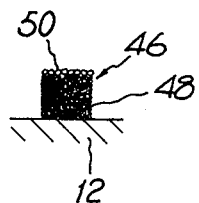
FIG. 4 is a greatly magnified sectional view of part of a circuit pattern produced in accordance with the process of the invention.

As illustrated cross-sectionally in FIG. 4, the copper circuit pattern 46 to be formed by plating in accordance with the process of our invention is composed of a major layer 48 of high density, fine crystal structure formed in direct contact with the metal strip 12 and a relatively thin, roughened surface layer 50 overlying the major layer. The high density major layer 48 occupies from about 90% to 95% of the desired total thickness of the copper circuit pattern 46, and the roughened surface layer 50 occupies the remainder of the total thickness. The high density major layer 48 is formed while the masked region of the metal strip 12 is held opposite to the first anode 36, and then the roughened surface layer 50 is formed while the masked region is subsequently held opposite to the second anode 38.

The copper plating bath 32 used in the process of our invention contains copper sulfate as its principal constituent, with the copper concentration in the bath being in the range of from about 1.0 to 2.0 moles per liter, for better results from about 1.2 to 1.8 moles per liter, and for the best results from about 1.4 to 1.6 moles per liter. The sulfuric acid concentration in the bath is in the range of from about 50 to 70 grams per liter. This electrolyte is further supplied in the form of a turbulent flow into and through the spacing between cathodic metal strip 12 and first anode 36 at a temperature ranging from about 55° to 70° C., and for the best results from about 60° to 65° C.

The use of the copper sulfate electrolyte as above is preferable because it permits the use of insoluble anodes. The first and second anodes 36 and 38 can therefore be maintained precisely at the prescribed distances from the cathodic metal strip 12 to make possible the fabrication of printed circuits of unfluctuating quality.

The temperature range of the electrolyte is specified as above because, at temperatures below about 55° C., the migration of copper ions would be retarded, resulting in a decrease in the copper deposition rate through formation of polarization layers. At temperatures in excess of about 70° C., the electrolyte would evaporate so much that substantial variation in the concentrations of its constituents might result. Furthermore, the metal strip 12 would expand so rapidly on immersion in the bath that the plating resist mask 42 might separate therefrom.

The electrolyte supplied turbulently into and through the spacing between cathodic metal strip 12 and first anode 36 has a speed in the range of from about 1.5 to 2.5 meters per second and, for the best results, of about 2 meters per second. The electrolyte should also be caused to flow turbulently at substantially the same, or slightly lower, speed and at substantially the same temperature through the spacing between cathodic metal strip 12 and second anode 38. Such turbulent flow of the electrolyte aids in preventing any undue decrease in the metal concentration in the adjacency of the cathodic metal strip 12 and in markedly increasing the metal deposition rate on the cathode through suppression of polarization layers.

Figure 5:
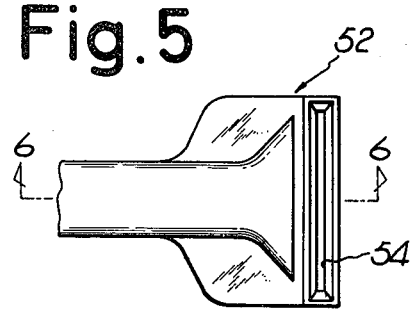
FIG. 5 is an enlarged, fragmentary plan view of a nozzle used in the apparatus of FIG. 1.
Figure 6:
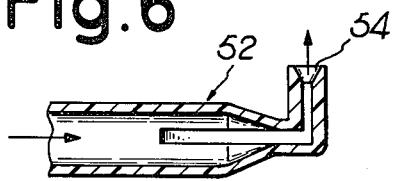
FIG. 6 is a sectional view taken along the line 6—6 of FIG. 5.

FIGS. 5 and 6 illustrate a nozzle 52 that can be employed satisfactorily for causing the turbulent flow of the electrolyte in the above described manner. It should be noted that the nozzle 52 has an outlet 54 of considerable length but of reduced width. The use of only one such nozzle has been found preferable. In the arrangement of FIG. 1, the nozzle 52 is shown mounted rearwardly of the first anode 36 with respect to the arrow marked travelling direction of the metal strip 12 through the plating bath, in order that the turbulent flow of the electrolyte may take place not only between first anode and metal strip but also between second anode and metal strip.

A current density in the range of from about 0.3 to 3.0 amperes per square centimeter has been found satisfactory in electroplating the metal strip 12 with copper for the formation of the circuit pattern 46 in accordance with the invention.

Thus, with the electroplating operation performed under the conditions specified hereinabove, the high density major layer 48 of the copper circuit pattern 46 can be formed at a deposition rate of from about 25 to 100 microns per minute while the masked region of the metal strip 12 is held opposite to the first anode 36. Subsequently, while the masked metal strip region is held opposite to the second anode 38, the roughened surface layer 50 can be formed on the major layer 48 at a deposition rate of from about 15 to 45 microns per minute. The density of this roughened surface layer 50 is in the range of from about 8.65 to 8.80 grams per cubic centimeter, and its electrical resistance in the range of from about 1.69 to 2.34 microhms per centimeter.

As may have been understood from the foregoing, the copper circuit pattern 46 can be efficiently formed on the masked metal strip 12 at a deposition rate of from about 15 to 100 microns per minute, which is about 10 to 40 times as high as that of the conventional plating process. As an additional advantage, the plated circuit pattern 12 has the roughened surface layer 50 which is intended to afford greater bond strength between the circuit pattern and the strip 20 of insulating base.

According to the process of our invention, the copper circuit pattern 46 thus formed on the metal strip 12 is then bonded to the insulating base strip 20, either before, after or substantially concurrently with the separation of the circuit pattern from the metal strip, and then the overlay strip 26 is bonded to the circuit pattern on the insulating base strip, through the procedure set forth hereinbelow.

Preferably, the insulating base strip 20 for use in the process of our invention is of flexible plastics film such as that made of polyimide or polyester resin, although a rigid insulating base can be employed as well. The use of the flexible base is preferred because the copper circuit pattern formed in accordance with the invention is itself so flexible that it is believed to be better suited for use in flexible printed circuit boards. The insulating base strip 20 used in the arrangement of FIG. 1 has one of its surfaces previously coated with adhesive material, with the adhesive coating having been dried subsequently. The adhesive material suitable for use will be discussed later.

On emerging from the plating bath 32, the metal strip 12 has its copper-plated region rinsed and dried with a suitable drier. According to the process of our invention, as practiced by use of the arrangement of FIG. 1, the dried copper circuit pattern on the metal strip 12 is then bonded to the adhesive coated base strip 20 as the latter is heated and pressed against the former by the first heater roll 18. It should be appreciated that the copper circuit pattern 46 can be firmly bonded to the insulating base strip 20 since the circuit pattern has the roughened surface layer 50 which makes direct contact with the base strip via the adhesive.

The copper circuit pattern 46 bonded to the insulating base strip 20 is then separated from the metal strip 12 by the separator roll 22 as the base strip is fed in a direction away from the metal strip as guided by pairs of guide rolls 56.

If desired, the plating resist mask 42 may be left on the metal strip 12 for repeated use. This is not preferable, however, since it would involve the additional steps of coating a release agent on the plating resist mask 42 and of visually inspecting, after removal of the copper circuit pattern, whether the mask is maintained in shape for further use or not. For higher production efficiency, therefore, the used resist mask may also be bonded to the insulating base and separated from the metal strip together with the circuit pattern. It is also possible to remove the used resist mask from the metal strip after separation of the circuit pattern therefrom.

The continuous overlay strip 26 can be made of flexible plastics film like the insulating base strip 20 and also has one of its surfaces previously coated with adhesive material, with the adhesive coating having been dried subsequently. It is further understood that this overlay strip has been previously punched in accordance with the circuit pattern to be formed on the metal strip 12. The overlay strip 26 is heated by the second heater roll 24 and is bonded by the pair of squeeze rolls 28 to the copper circuit pattern that has been bonded to the insulating base strip 20.

The bonding of the overlay film to the copper circuit pattern on the insulating base strip, however, is not an essential feature of our invention. The overlay film may be replaced, for example, by a resist ink coating applied by either printing or spraying, without departure from the scope of the invention.

The temperature at which the insulating base strip 20 and the overlay strip 26 are bonded as above to the copper circuit pattern 46 may usually range from about 120° to 150° C., depending upon the adhesive material in use. The bond strength afforded by the adhesive material should be sufficiently high to cause ready separation of the copper circuit pattern from the metal strip and to prevent deterioration of the circuit pattern or the film during the subsequent application of the overlay. Such requirements have been found to be met by adhesives made of epoxies. The bonding operations proceed in synchronism with the formation of the successive copper circuit patterns on the masked metal strip 12 by electroplating.

Following the separation of the copper circuit pattern 46 and the plating resist mask 42, the exposed region of the metal strip 12 is rinsed and dried, and a fresh plating resist mask is formed on that region of the metal strip. Thereafter the foregoing procedure is repeated for the continuous fabrication of successive printed circuits.

The lamination of the base strip 20, the copper circuit patterns 46 together with or without the plating resist masks 42, and the overlay strip 26, which has been produced in the above described manner, is then subjected to the necessary finishing operations well known to those skilled in the art, to provide completed printed circuit boards.

The process according to our invention is hereinafter described in terms of its specific Example, which, however, is meant purely to illustrate or explain and not to impose limitations upon the invention.

EXAMPLE

The arrangement of FIG. 1 was employed for the fabrication of printed circuits in accordance with the process of our invention. A plating resist mask such as that shown at 42 in FIGS. 2 and 3 was formed by the usual printing process on the endless metal strip 12, which was of stainless steel, and this stainless steel strip was made cathodic in the copper plating bath 32 as shown.

Copper sulfate was used as the principal constituent of the copper plating bath, with the copper concentration of 1.5 moles per liter and the sulfuric acid concentration of 60 grams per liter. This electrolyte was recycled, by being drawn out of the tank 30 and delivered back through the nozzle 52 as a turbulent flow into the spacing between the masked region of the cathodic stainless steel strip 12 and the first anode 36 at a temperature of 60° C. ± 1° C. and at a speed of about 2 meters per second. Such turbulent flow of the electrolyte also took place, although at a slightly lesser speed, in the spacing between the stainless steel strip 12 and the second anode 38.

The masked region of the stainless steel strip 12 was first held opposite to the first anode 36, which was spaced 2 millimeters from the strip, and an electric current was introduced for about 50 seconds with a current density of 2.5 amperes per square centimeter. As a consequence, copper was deposited on the masked region of the stainless steel strip to a thickness of about 47.5 microns to form the major layer 48 of high density, fine crystal structure in the exact shape of the desired circuit pattern.

Subsequently, the masked region of the stainless steel strip 12 was placed opposite to the second anode 38, which was spaced 10 millimeters from the strip, and an electric current was introduced for about 10 seconds. The roughened surface layer 50 was thus formed in overlaying relationship to the major layer 48 to complete the copper circuit pattern 46 on the stainless steel strip 12. The roughened surface layer 50 had a thickness of about 2.5 microns.

As will be apparent from the foregoing, the copper deposition rate during formation of the major layer 48 is about 57 microns per minute, and that during formation of the roughened surface layer 50 about 15 microns per minute. These are surprisingly high rates compared with the deposition rate attained by the conventional plating process.

The roughened surface layer 50 had a density of 8.65 grams per cubic centimeter and an electrical resistance of 1.69 microhms per centimeter. The completed copper circuit pattern 46 had such flexibility that it was found quite suitable for use in a flexible printed circuit board.

The copper circuit pattern 46 as well as the plating resist mask 42 was then bonded to the insulating base strip 20 of flexible plastics film under heat and pressure and was separated from the stainless steel strip 12 in the above described manner. The bond strength between the copper circuit pattern and the base strip was 1.5 kilograms per centimeter.

The overlay strip 26, also of flexible plastics film, was then bonded to the copper circuit pattern and plating resist mask on the insulating base strip 20. The region of the stainless steel strip 12 from which the copper circuit pattern and plating resist mask had been removed was then rinsed and dried, and a fresh plating resist mask was formed on that region to repeat the foregoing procedure.

In fabricating successive printed circuits by the repetition of the above procedure, the steps of forming the copper circuit patterns, bonding the circuit patterns to the stainless steel strip, and bonding the overlay strip to the circuit patterns on the steel strip, could be completely synchronized. The successive printed circuits could therefore be produced continuously in an automatic sequence.

While we have shown and described our invention in its specific aspects, it is understood that the invention is not to be restricted by the exact details of this disclosure. For example, instead of forming the copper circuit patterns on the endless metal strip 12 extending between the pair of rolls 14 and 16, the circuit patterns may be formed on a metal-made drum or on any other metal surface which preferably is continuous or endless. This and numerous other modifications or changes will readily occur to the specialists on the basis of this disclosure, without departing from the spirit or scope of our invention as expressed in the appended claims.

We claim:

1. A process for the fabrication of printed circuits which comprises:
   a. masking a metal surface with a plating resist so as to leave exposed areas to form a circuit pattern;
   b. making said metal surface cathodic in an electrolyte containing copper sulfate, with the copper concentration in said electrolyte being in the range of from about 1 to 2 moles per liter;
   c. forming a high density major layer which is about 90% to about 95% of the desired thickness of the circuit pattern by electroplating said exposed areas at a current density of between about 0.3 to about 3.0 amp/CM$^2$ of said metal surface with copper while said metal surface is held opposite to a first insoluble anode in said electrolyte with a predetermined spacing of about 1 to about 10 mm therebetween, said electrolyte being force-fed to flow turbulently at predetermined speed of about 1.5 to 2.5 meters per second at a temperature of about 55° C to about 70° C through the spacing between said metal surface and said first insoluble anode during formation of said major layer;
   d. forming a relatively thin, roughened surface layer of from about 5% to about 10% of the desired thickness of the circuit pattern by electroplating the surface of said major layer with copper while said major layer formed on said metal surface is held opposite to a second insoluble anode in said electrolyte, said metal surface being held spaced from said second insoluble anode a distance greater than said predetermined spacing during formation of said roughened surface layer, said electrolyte being caused to flow turbulently through the spacing between said major layer on said metal surface and said second insoluble anode at speed substantially equal to said predetermined speed but slower and at a temperature substantially equal to said temperature during formation of said major surface layer; and e. attaching the completed circuit pattern to an insulating base by bonding said roughened surface layer thereto.

2. The process as recited in claim 1, wherein the concentration of sulfuric acid in said electrolyte is in the range of from about 50 to 70 grams per liter.

3. The process as recited in claim 1, wherein the distance between said metal surface and said first insoluble anode during formation of said major layer is in the range of from about 1 to 10 millimeters, and wherein the distance between said metal surface and said second insoluble anode during formation of said roughened surface layer is in the range of from about 5 to 25 millimeters.

4. A continuous process for the fabrication of printed circuits by causing a metal surface to travel through a series of work zones wherein work operations are performed comprising in the work zones the steps of:

a. providing an endless, movable metal surface, said metal surface being partly immersed and made cathodic in an electrolyte containing copper sulfate;

b. masking part of said metal surface with a plating resist so as to leave exposed areas to form a circuit pattern;

c. forming a high density major layer which is about 90% to about 95% of the desired thickness of the circuit pattern by electroplating said exposed areas at a current density of between about 0.3 to about 3.0 amp ($CM^2$) with copper while the masked part of said metal surface is held opposite to a first anode in said electrolyte with a predetermined spacing of about 1 to about 10mm therebetween, said electrolyte being force-fed to flow turbulently at predetermined speed of about 1.5 to 2.5 meters per second at a temperature of about 55° C to 70° C through the spacing between the masked part of said metal surface and said first anode during formation of said major layer;

d. forming a relatively thin, roughened surface layer of from about 5% to about 10% of the desired thickness of the circuit pattern by electroplating the surface of said major layer at a current density of between about 0.3 to 3.0 amp/$CM^2$ with copper while the masked part of said metal surface is held opposite to a second anode in said electrolyte, the masked part of said metal surface being held spaced from said second anode a distance greater than said predetermined spacing during formation of said roughened surface layer, said electrolyte being caused to flow turbulently through the spacing between said major layer on the masked part of said metal surface and said second anode at speed substantially equal to said predetermined speed but slower and at a temperature substantially equal to said temperature during formation of said major surface layer;

e. bonding a continuous strip of insulating base at least to said roughened surface layer of the completed circuit pattern on the masked part of said metal strip; and f. separating the circuit pattern from said metal surface.

5. The process as recited in claim 4, wherein said continuous strip of insulating base is bonded to said roughened surface layer via an adhesive layer which has been coated on one of the surfaces of said strip of insulating base.

6. The process as recited in claim 4, further comprising the step of bonding a continuous strip of overlay to the circuit pattern which has been bonded to said strip of insulating base and separated from said metal surface.

7. The process as recited in claim 4, wherein said strip of insulating base is bonded to both of the completed circuit pattern and the plating resist mask on said metal surface, said circuit pattern and said plating resist mask being subsequently simultaneously separated from said metal surface.

8. The process as recited in claim 7, further comprising the step of bonding a continuous strip of overlay to the circuit pattern and the plating resist mask which have been bonded to said strip of insulating base and separated from said metal surface.

* * * * *